(12) United States Patent
Cai et al.

(10) Patent No.: US 9,502,504 B2
(45) Date of Patent: Nov. 22, 2016

(54) SOI LATERAL BIPOLAR TRANSISTORS HAVING SURROUNDING EXTRINSIC BASE PORTIONS

(71) Applicant: International Business Machines Corporation, Armonk, NY (US)

(72) Inventors: Jin Cai, Cortlandt Manor, NY (US); Kevin K. Chan, Staten Island, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 14/134,611

(22) Filed: Dec. 19, 2013

(65) Prior Publication Data
US 2015/0179778 A1 Jun. 25, 2015

(51) Int. Cl.
*H01L 29/735* (2006.01)
*H01L 29/66* (2006.01)
*H01L 29/10* (2006.01)
*H01L 27/12* (2006.01)
(Continued)

(52) U.S. Cl.
CPC .......... *H01L 29/1008* (2013.01); *H01L 21/84* (2013.01); *H01L 27/1203* (2013.01); *H01L 29/66265* (2013.01); *H01L 29/7317* (2013.01)

(58) Field of Classification Search
CPC .................. H01L 29/735; H01L 29/1008
USPC ............................................. 257/557
See application file for complete search history.

(56) References Cited

U.S. PATENT DOCUMENTS

| | | | |
|---|---|---|---|
| 4,956,305 A * | 9/1990 | Arndt | H01L 21/2652 148/DIG. 10 |
| 5,031,014 A * | 7/1991 | Soclof | H01L 21/26586 257/526 |

(Continued)

FOREIGN PATENT DOCUMENTS

JP 2007329211 12/2007

OTHER PUBLICATIONS

U.S. Appl. No. 13/625,440 entitled, "SOI Lateral Bipolar Transistors Having Surrounding Extrinsic Base Portions" filed on Dec. 19, 2013, First Named Inventor: Tak H. Ning.

*Primary Examiner* — Andy Huynh
*Assistant Examiner* — Sitaramarao S Yechuri
(74) *Attorney, Agent, or Firm* — Scully, Scott, Murphy & Presser, P.C.; Louis J. Percello, Esq.

(57) ABSTRACT

Lateral SOI bipolar transistor structures are provided including an intrinsic base semiconductor material portion in which all surfaces of the intrinsic base not forming an interface with either a collector semiconductor material portion or an emitter semiconductor material portion, contain an extrinsic base semiconductor material portion. Each extrinsic base semiconductor material portion is of the same conductivity type as that of the intrinsic base semiconductor material portion, yet each extrinsic base semiconductor material portion has a higher dopant concentration than the intrinsic base semiconductor material portion. The intrinsic base semiconductor material portion of the lateral SOI bipolar transistors of the present application does not have any interface with surrounding insulator material layers. As such, any potential charge build-up in the surrounding insulator material layers is shielded by the extrinsic base semiconductor material portions.

20 Claims, 6 Drawing Sheets

(51) Int. Cl.
*H01L 21/84* (2006.01)
*H01L 29/73* (2006.01)

(56) References Cited

U.S. PATENT DOCUMENTS

| | | | | |
|---|---|---|---|---|
| 5,583,059 | A * | 12/1996 | Burghartz | H01L 27/0605 148/DIG. 10 |
| 5,796,157 | A * | 8/1998 | Fallico | H01L 29/735 257/557 |
| 5,994,740 | A * | 11/1999 | Nakagawa | H01L 27/1203 257/350 |
| 6,642,088 | B1 * | 11/2003 | Yu | H01L 21/76264 257/E21.564 |
| 6,989,322 | B2 | 1/2006 | Gluschenkov et al. | |
| 7,935,590 | B2 | 5/2011 | Lan et al. | |
| 8,138,053 | B2 | 3/2012 | Utomo et al. | |
| 8,288,754 | B2 | 10/2012 | Bidal et al. | |
| 8,526,220 | B2 | 9/2013 | Cai et al. | |
| 2006/0151837 | A1 | 7/2006 | Chen et al. | |
| 2011/0165739 | A1 | 7/2011 | Majumdar et al. | |
| 2011/0227162 | A1 | 9/2011 | Lin et al. | |
| 2013/0168821 | A1 | 7/2013 | Cai | |
| 2013/0200942 | A1 | 8/2013 | Cai | |

* cited by examiner

SOI LATERAL BIPOLAR TRANSISTORS HAVING SURROUNDING EXTRINSIC BASE PORTIONS

BACKGROUND

The present application relates to a semiconductor structure and a method of forming the same. More particularly, the present application relates to a semiconductor-on-insulator (SOI) lateral bipolar transistor having a completely shielded intrinsic base semiconductor material portion and a method of forming the same.

Bipolar junction transistors are typically found in demanding types of analog circuits, especially analog circuits used in high-frequency applications. For example, bipolar junction transistors can be found in radio frequency integrated circuits (RFICs) used in wireless communication systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors such as vertical bipolar transistors, include three semiconductor regions, namely the emitter, base, and collector regions. Generally, a bipolar junction transistor includes a pair of p-n junctions, namely an emitter-base junction and a collector-base junction. A heterojunction bipolar transistor (HBT) is a variety of bipolar junction transistor that employs at least two semiconductor materials with unequal band gaps for the emitter/collector and base regions, creating a heterojunction.

With the advent of semiconductor-on-insulator (SOI) technology, innovative thin-base lateral bipolar transistors have been developed. In prior art SOI lateral bipolar transistors, charge build-up may occur in the buried oxide layer of the SOI substrate that is located directly beneath the lightly doped intrinsic base. Charge build-up within the buried oxide layer of such a structure can change the device characteristic. For example, charge build-up in the buried oxide layer of SOI lateral bipolar transistors can change the device collector current. Hence, there is a need for providing SOI lateral bipolar transistors in which charge build-up within the buried oxide layer of such a structure is circumvented.

SUMMARY

Lateral SOI bipolar transistor structures are provided including an intrinsic base semiconductor material portion in which all surfaces of the intrinsic base not forming an interface with either a collector semiconductor material portion or an emitter semiconductor material portion, contain an extrinsic base semiconductor material portion. Each extrinsic base semiconductor material portion is of the same conductivity type as that of the intrinsic base semiconductor material portion, yet each extrinsic base semiconductor material portion has a higher dopant concentration than the intrinsic base semiconductor material portion. The intrinsic base semiconductor material portion of the lateral SOI bipolar transistors of the present application does not have any interface with surrounding insulator material layers. As such, any potential charge build-up in the surrounding insulator material layers is shielded by the extrinsic base semiconductor material portions.

In one aspect of the present application, a semiconductor structure is provided. In one embodiment of the present application, the semiconductor structure may include at least one first lateral bipolar transistor including an intrinsic base semiconductor material portion of a first conductivity type located atop an insulator layer. The intrinsic base semiconductor material portion of the first conductivity type has a bottommost surface, an uppermost surface, and two vertical sidewalls oriented in a width-wise direction (it also includes two vertical sidewalls oriented in a non-width wise direction). A first horizontal semiconductor material portion of the first conductivity type is positioned between the bottommost surface of the intrinsic base semiconductor material portion of the first conductivity type and the uppermost surface of the insulator layer. A second horizontal semiconductor material portion of the first conductivity type is located directly on the uppermost surface of the intrinsic base semiconductor material portion of the first conductivity type. A first sidewall semiconductor material portion of the first conductivity type is located at one vertical sidewall of the intrinsic base semiconductor material portion of the first conductivity type that is oriented in the width-wise direction and a second sidewall semiconductor material portion of the first conductivity type is located at another vertical sidewall of the intrinsic base semiconductor material portion of the first conductivity type that is oriented in the width-wise direction. In accordance with the present application, the first horizontal semiconductor material portion of the first conductivity type, the second horizontal semiconductor material portion of the first conductivity type, and the first and second sidewall semiconductor material portions of the first conductivity type each have a higher dopant concentration than the intrinsic base semiconductor material portion of the first conductivity type.

Another aspect of the present application relates to a method of forming a semiconductor structure. In one embodiment, the method of the present application may include providing a semiconductor stack comprising, from bottom to top, a first horizontal semiconductor material region of a first conductivity type and a first dopant concentration and an intrinsic base semiconductor material of the first conductivity type and a second dopant concentration, on a surface on an insulator layer, wherein the first dopant concentration is greater than the second dopant concentration. Next, sidewall semiconductor material portions of the first conductivity type and the first dopant concentration are formed within each vertical sidewall of the intrinsic base semiconductor material of the first conductivity type that is oriented in a width-wise direction. A second horizontal semiconductor material region of the first conductivity type and the first dopant concentration is formed atop the intrinsic base semiconductor material of the first conductivity type. Next, portions of the second horizontal semiconductor material region of the first conductivity type, portions of the sidewall semiconductor material portions of the first conductivity type, portions of the intrinsic base semiconductor material of the first conductivity type, and portions of the first horizontal semiconductor material region of the first conductivity type are removed to provide a first conductivity type material stack. The first conductivity type material stack that is formed includes, from bottom to top, a remaining portion of the first horizontal semiconductor material region of the first conductivity type, a remaining portion of the intrinsic base semiconductor material of the first conductivity type, and a remaining portion of the second horizontal semiconductor material region of the first conductivity type. In accordance with the present application, a remaining portion of the sidewall semiconductor material portions of the first conductivity type is present on each vertical sidewall of the remaining portion of the intrinsic base semiconductor material of the first conductivity type in the width-wise direction.

BRIEF DESCRIPTION OF SEVERAL VIEWS OF THE DRAWINGS

FIG. 9 is a cross sectional view of the exemplary semiconductor structure of FIG. 8A after formation of an emitter semiconductor material portion of the second conductivity type in a lower portion of the emitter opening located adjacent the first conductivity type material stack, a collector semiconductor material portion of the second conductivity type in a lower portion of the collector opening located adjacent the first conductivity type material stack, an emitter semiconductor material portion of the first conductivity type in a lower portion of the emitter opening located adjacent the second conductivity type material stack, and a collector semiconductor material portion of the first conductivity type in a lower portion of the collector opening located adjacent the second conductivity type material stack.

DETAILED DESCRIPTION

The present application will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

Figure 1:
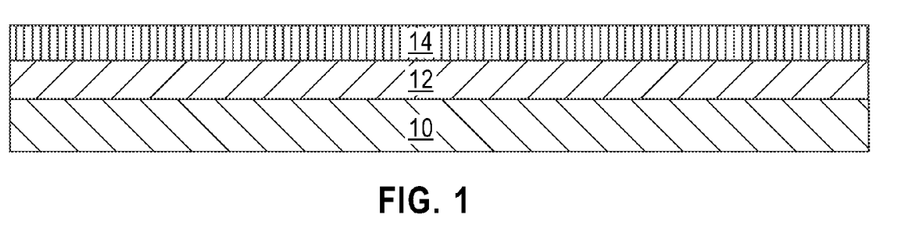
FIG. 1 is a cross sectional view of an exemplary semiconductor structure including, from bottom to top, a handle substrate, an insulator layer and a semiconductor material layer that can be used in one embodiment of the present application.

Reference is now made to FIG. 1, which illustrates an exemplary semiconductor structure including, from bottom to top, a handle substrate 10, an insulator layer 12 and a semiconductor material layer 14 that can be used in one embodiment of the present application. Collectively, the handle substrate 10, the insulator layer 12 and the semiconductor material layer 14 can be referred to herein as a semiconductor-on-insulator.

In some embodiments of the present application, the handle substrate 10 and the semiconductor material layer 14 of the SOI substrate may comprise a same, or different, semiconductor material. The term "semiconductor" as used herein in connection with the semiconductor material of the handle substrate 10 and the semiconductor material layer 14 denotes any semiconductor material including, for example, Si, Ge, SiGe, SiC, SiGeC, and III/V compound semiconductors. Multilayers of these semiconductor materials can also be used as the semiconductor material of the handle substrate 10 and the semiconductor material layer 14. In one embodiment, the handle substrate 10 and semiconductor material layer 14 are both comprised of silicon. In other embodiments of the present application, the handle substrate 10 and the semiconductor material layer 14 are both comprised of silicon germanium. The semiconductor material layer 14 of the SOI substrate employed in the present application is an undoped semiconductor material, while the handle substrate 10 may comprise a doped or undoped semiconductor material. In some embodiments, the handle substrate 10 is a non- semiconductor material including, for example, a dielectric material and/or a conductive material.

When the handle substrate 10 and the semiconductor material layer 14 of the SOI substrate comprise a semiconductor material, the handle substrate 10 and the semiconductor material layer 14 may have a same or different crystal orientation. For example, the crystal orientation of the handle substrate 10 and/or the semiconductor material layer 14 of the SOI substrate may be {100}, {110}, or {111}. Other crystallographic orientations besides those specifically mentioned can also be used in the present application. The handle substrate 10 and/or the semiconductor material layer 14 of the SOI substrate may be a single crystalline semiconductor material, a polycrystalline material, or an amorphous material. In some embodiments of the present application, at least the semiconductor material layer 14 of the SOI substrate is a single crystalline semiconductor material such as, for example, single crystal silicon. In some embodiments (not shown), the semiconductor material layer 14 can be processed to include semiconductor regions having different crystal orientations.

The insulator layer 12 of the SOI substrate, which may also be referred to herein as a buried insulator layer, may be a crystalline or non-crystalline oxide or nitride. In one embodiment, the insulator layer 12 is an oxide such as, for example, silicon oxide. In some embodiments of the present application, the insulator layer 12 is continuously present between the handle substrate 10 and the semiconductor material layer 14 of the SOI substrate.

In one embodiment of the present application, the SOI substrate shown in FIG. 1 may be formed by a process referred to as SIMOX (separation by ion implantation of oxygen). In another embodiment, the SOI substrate shown in FIG. 1 may be formed by a layer transfer process in which two semiconductor wafers, one of which includes an insulator layer, i.e., an oxide layer, are bonded together. In another embodiment, the SOI substrate may be formed by deposition of an insulator material and a semiconductor material on a handle substrate. In any of the processes mentioned above, an optional thinning step may used to thin the semiconductor material layer 14 of the SOI substrate to a desired and predetermined thickness value. The optional thinning step may include, for example, planarization or etching.

In one embodiment of the present application, the thickness of the semiconductor material layer 14 of the SOI substrate is from 10 nm to 100 nm. Other thickness that are lesser than or greater than the aforementioned thickness range can also be used as the thickness of the semiconductor material layer 14 of the SOI substrate. In one embodiment of the present application, the insulator layer 12 of the SOI substrate has a thickness from 1 nm to 200 nm. Other thickness that are lesser than or greater than the aforementioned thickness range can also be used as the thickness of the insulator layer 12 of the SOI substrate. The thickness of the handle substrate 10 of the SOI substrate is inconsequential to the present application.

Figure 2:
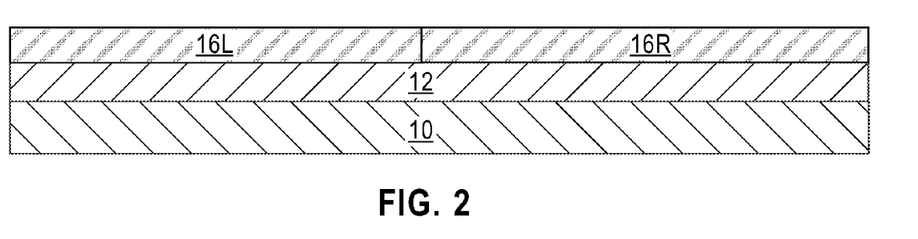
FIG. 2 is a cross sectional view of the exemplary semiconductor structure of FIG. 1 after forming a first horizontal semiconductor material region of a first conductivity type and a first dopant concentration within a first region of the semiconductor material layer and forming a first horizontal semiconductor material region of a second conductivity type and a second dopant concentration within a second region of the semiconductor material layer, wherein the second conductivity type is different from the first conductivity type.

Referring now to FIG. 2, there is illustrated the exemplary semiconductor structure of FIG. 1 after forming a first horizontal semiconductor material region 16L of a first conductivity type and a first dopant concentration within a first region of the semiconductor material layer 14 and forming a first horizontal semiconductor material region 16R of a second conductivity type and a second dopant concentration within a second region of the semiconductor material layer 14, wherein the second conductivity is different from the first conductivity type. Although the drawings and following description illustrate the formation of both first horizontal semiconductor material regions 16L, 16R within semiconductor material layer 14, embodiments are possible in which only one of the first horizontal semiconductor material regions 16L or 16R is formed within the semiconductor material layer 14.

When both the first horizontal semiconductor material regions 16L, 16R are formed, npn and pnp lateral bipolar transistors in accordance with the present application can be formed on a same semiconductor chip. When only one of the first horizontal semiconductor material regions 16L or 16R is formed, only an npn or a pnp lateral bipolar transistor is formed.

In some embodiments of the present application and as is shown in FIG. 2, a vertical edge of the first horizontal semiconductor material region 16L of the first conductivity type may be in direct physical contact with a vertical edge of the first horizontal semiconductor material region 16R of the second conductivity type. In other embodiments of the present application, the vertical edge of the first horizontal semiconductor material region 16L of the first conductivity type is separated from a vertical edge of the first horizontal semiconductor material region 16R of the second conductivity type by an undoped portion of the semiconductor material layer 14.

Since the first horizontal semiconductor material region 16L of the first conductivity type and the first horizontal semiconductor material region 16R of the second conductivity type are both formed within regions of the semiconductor material layer 14, both of the first horizontal semiconductor material regions 16L, 16R comprise a same semiconductor material and have a same thickness as that of the semiconductor material layer 14.

In one embodiment, the first horizontal semiconductor material region 16L of the first conductivity type is an n-type first horizontal semiconductor material region containing n-type dopants, and the first horizontal semiconductor material region 16R of the second conductivity type is a p-type first horizontal semiconductor material region containing p-type dopants. In another embodiment, the first horizontal semiconductor material region 16L of the first conductivity type is a p-type first horizontal semiconductor material region containing p-type dopants, and the first horizontal semiconductor material region 16R of the second conductivity type is an n-type first horizontal semiconductor material region containing n-type dopants.

The term "p-type" refers to the addition of impurities to an undoped semiconductor that creates deficiencies of valence electrons. Some examples of p-type dopants, i.e., impurities, include, but are not limited to, boron, aluminum, gallium and indium. "N-type" refers to the addition of impurities that contributes free electrons to an undoped semiconductor. Some examples of n-type dopants, i.e., impurities, include, but are not limited to, antimony, arsenic and phosphorous.

The first dopant concentration of the first horizontal semiconductor material region 16L of the first conductivity type is greater than a dopant concentration of an intrinsic base semiconductor material of the first conductivity type to be subsequently formed atop the first horizontal semiconductor material region 16L of the first conductivity type. In one example, the first dopant concentration of the first horizontal semiconductor material region 16L of the first conductivity type is from $10^{18}$ atoms/cm$^3$ to $10^{20}$ atoms/cm$^3$. In another example, the first dopant concentration of the first horizontal semiconductor material region 16L of the first conductivity type is from $10^{19}$ atoms/cm$^3$ to $10^{21}$ atoms/cm$^3$. Other first dopant concentrations can be used so long as the first dopant concentration of the first horizontal semiconductor material region 16L of the first conductivity type is greater than the dopant concentration of the intrinsic base semiconductor material of the first conductivity type to be subsequently formed atop the first horizontal semiconductor material region 16L of the first conductivity type.

The second dopant concentration of the first horizontal semiconductor material region 16R of the second conductivity type is greater than a dopant concentration of an intrinsic base semiconductor material of the second conductivity type to be subsequently formed atop the first horizontal semiconductor material region 16R of the second conductivity type. In one example, the second dopant concentration of the first horizontal semiconductor material region 16R of the second conductivity type is from $10^{18}$ atoms/cm$^3$ to $10^{20}$ atoms/cm$^3$. In another example, the second dopant concentration of the first horizontal semiconductor material region 16R of the second conductivity type is from $10^{19}$ atoms/cm$^3$ to $10^{21}$ atoms/cm$^3$. Other second dopant concentrations can be used so long as the second dopant concentration of the first horizontal semiconductor material region 16R of the second conductivity type is greater than the dopant concentration of the intrinsic base semiconductor material of the second conductivity type to be subsequently formed atop the first horizontal semiconductor material region 16R of the second conductivity type.

In some embodiments of the present application, the first dopant concentration of the first horizontal semiconductor material region 16L of the first conductivity type is the same as that of the second dopant concentration of the first horizontal semiconductor material region 16R of the second conductivity type. In other embodiments of the present application, the first dopant concentration of the first horizontal semiconductor material region 16L of the first conductivity type is different, i.e., lesser than or greater than, the second dopant concentration of the first horizontal semiconductor material region 16R of the second conductivity type.

The first horizontal semiconductor material region 16L of the first conductivity type and the first horizontal semiconductor material region 16R of the second conductivity type can be formed into different regions of the semiconductor material layer 14 in any order. In one example, the first horizontal semiconductor material region 16L of the first conductivity type can be formed first, followed by the formation of the first horizontal semiconductor material region 16R of the second conductivity type. In another example, the first horizontal semiconductor material region 16R of the second conductivity type can be formed first, followed by the formation of the first horizontal semiconductor material region 16L of the first conductivity type.

In either case, a first block mask can be formed over one of the regions of the semiconductor material layer 14 utilizing deposition, lithography and etching. After protecting one of the regions of the semiconductor material layer 14 with the first block mask, an n-type or p-type dopant is introduced into the region of the semiconductor material layer 14 not including the first block mask. Following the introduction of the n-type or p-type dopant into the one region of the semiconductor material layer 14, the first block mask can be removed from the previously protected region of the semiconductor material layer 14, and a second block mask can be formed on the region of the semiconductor material layer 14 in which the n-type or p-type dopant was previously introduced. With the second block mask in place, a dopant of the opposite conductivity type (i.e., either n-type or p-type dopant not previously formed into the semiconductor material layer 14) is introduced into the region of the semiconductor material layer 14 not including the second block mask. Following the introduction of this opposite conductivity type dopant into a region of the semiconductor material layer 14 not including the second block mask, the second block mask can be removed from structure. The removal of the first and second block masks can be performed utilizing any conventional stripping process.

In one embodiment of the present application, the introduction of the n-type and p-type dopants into various regions of the semiconductor material layer 14 can be performed by ion implantation. In another embodiment of the present application, the introduction of the n-type and p-type dopants into various regions of the semiconductor material layer 14 can be performed by gas phase doping. In a further embodiment of the present application, the introduction of the n-type and p-type dopants into various regions of the semiconductor material layer 14 can be performed by out-diffusion of a dopant from a sacrificial dopant source material. In an even further embodiment of the present application, any combination of the above mentioned techniques can be used to introduce the n-type and p-type dopants into various regions of the semiconductor material layer 14.

Following the introduction of the n-type and p-type dopants into various regions of the semiconductor material layer 14, a thermal anneal can be used to activate the dopants within the different regions of the semiconductor material layer 14. In one embodiment, the thermal anneal can be performed after each conductivity type dopant is introduced into the semiconductor material layer 14. In another embodiment, a first thermal anneal can be employed after the introduction of the n-type or p-type dopant into one region of the semiconductor material layer 14, and a second thermal anneal can be employed after introducing the opposite conductivity type dopant with another region of the semiconductor material layer 14. In either embodiment, the thermal anneal can be performed at a temperature of greater than 650° C.

Figure 3:
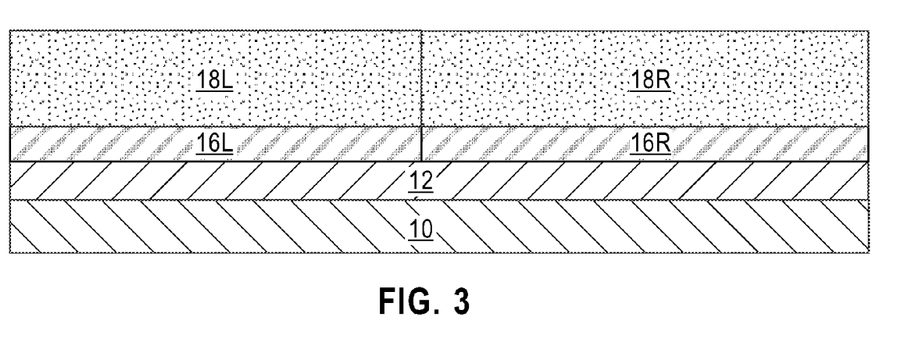
FIG. 3 is a cross sectional view of the exemplary semiconductor structure of FIG. 2 after forming an intrinsic base semiconductor material of the first conductivity type and a dopant concentration that is less than the first dopant concentration on an upper surface of the first horizontal semiconductor material region of the first conductivity type, and an intrinsic base semiconductor material of the second conductivity type and a dopant concentration that is less than the second dopant concentration on an upper surface of the first horizontal semiconductor material region of the second conductivity type.

Referring now to FIG. 3, there is illustrated the exemplary semiconductor structure of FIG. 2 after forming an intrinsic base semiconductor material 18L of the first conductivity type and a dopant concentration that is less than the first dopant concentration on an upper surface of the first horizontal semiconductor material region 16L of the first conductivity type, and an intrinsic base semiconductor material 18R of the second conductivity type and a dopant concentration that is less than the second dopant concentration on an upper surface of the second horizontal semiconductor material 16R of the second conductivity type.

The intrinsic base semiconductor material 18L of the first conductivity type and the intrinsic base semiconductor material 18R of the second conductivity type comprise a same semiconductor material selected from one of the semiconductor materials mentioned above for semiconductor material layer 14. In one embodiment of the present application, the intrinsic base semiconductor material 18L of the first conductivity type and the intrinsic base semiconductor material 18R of the second conductivity type comprise a same semiconductor material as the semiconductor material layer 14. For example, each of the intrinsic base semiconductor material 18L of the first conductivity type, the intrinsic base semiconductor material 18R of the second conductivity type, and the semiconductor material layer 14 may comprise Si or SiGe. In another embodiment of the present application, the intrinsic base semiconductor material 18L of the first conductivity type and the intrinsic base semiconductor material 18R of the second conductivity type comprise a different semiconductor material as the semiconductor material layer 14. For example, each of the intrinsic base semiconductor material 18L of the first conductivity type and the intrinsic base semiconductor material 18R of the second conductivity type may comprise SiGe, while the semiconductor material layer 14 may comprise Si.

The intrinsic base semiconductor material 18L of the first conductivity type may have an epitaxial relationship, i.e., identical crystal surface, as the upper surface of the first horizontal semiconductor material region 16L of the first conductivity type, and the intrinsic base semiconductor material 18R of the second conductivity type may have an epitaxial relationship, i.e., identical crystal surface, as that of the second horizontal semiconductor material 16R of the second conductivity type.

In one embodiment, the intrinsic base semiconductor material 18L of the first conductivity type is an n-type intrinsic base semiconductor material containing n-type dopants, and the intrinsic base semiconductor material 18R of the second conductivity type is a p-type intrinsic base semiconductor material containing p-type dopants. In another embodiment, the intrinsic base semiconductor material 18L of the first conductivity type is a p-type intrinsic base semiconductor material containing p-type dopants, and the intrinsic base semiconductor material 18R of the second conductivity type is an n-type intrinsic base semiconductor material containing n-type dopants. The term "p-type" and "n-type" used here for describing the intrinsic base semiconductor material 18L, 18R are the same as previously described above.

The dopant concentration of the intrinsic base semiconductor material 18L of the first conductivity type is less than the first dopant concentration of the first horizontal semiconductor material region 16L of the first conductivity type. In one example, the dopant concentration of the intrinsic base semiconductor material 18L of the first conductivity type is from $10^{17}$ atoms/cm$^3$ to $10^{19}$ atoms/cm$^3$. In another example, the dopant concentration of the intrinsic base semiconductor material 18L of the first conductivity type is from $10^{18}$ atoms/cm$^3$ to $10^{20}$ atoms/cm$^3$. Other dopant concentrations can be used so long as the dopant concentration of the intrinsic base semiconductor material 18L of the first conductivity type is less than the first dopant concentration of the first horizontal semiconductor material region 16L of the first conductivity type.

The dopant concentration of the intrinsic base semiconductor material 18R of the second conductivity type is less than the second dopant concentration of the first horizontal semiconductor material region 16R of the second conductivity type. In one example, the dopant concentration of the intrinsic base semiconductor material 18R of the second conductivity type is from $10^{17}$ atoms/cm$^3$ to $10^{19}$ atoms/cm$^3$. In another example, the dopant concentration of the intrinsic base semiconductor material 18R of the second conductivity type is from $10^{18}$ atoms/cm$^3$ to $10^{20}$ atoms/cm$^3$. Other dopant concentrations can be used so long as the dopant concentration of the intrinsic base semiconductor material 18R of the second conductivity type is less than the second dopant concentration of the first horizontal semiconductor material region 16R of the second conductivity type.

In some embodiments of the present application, the dopant concentration of the intrinsic base semiconductor material 18L of the first conductivity type is the same as that of the concentration of the intrinsic base semiconductor material 18R of the second conductivity type. In other embodiments of the present application, the dopant concentration of the intrinsic base semiconductor material 18L of the first conductivity type is lesser than or greater than the dopant concentration of the intrinsic base semiconductor material 18R of the second conductivity type.

The intrinsic base semiconductor material 18L of the first conductivity type and the intrinsic base semiconductor material 18R of the second conductivity type are formed by first epitaxial growing (i.e., epitaxial depositing) an undoped semiconductor layer on the exposed surfaces of the entire structure shown in FIG. 2. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

In one embodiment, the undoped semiconductor material that is formed has a thickness from 10 nm to 200 nm. Other thicknesses that are greater than or lesser than the aforementioned thickness range can also be used for the thickness of the undoped semiconductor material.

Examples of various epitaxial growth process apparatuses that are suitable for use in forming the undoped semiconductor material used in providing the intrinsic base semiconductor material 18L of the first conductivity type and the intrinsic base semiconductor material 18R of the second conductivity type include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process typically ranges from 550° C. to 900° C. Although higher temperature typically results in faster deposition, the faster deposition may result in crystal defects and film cracking.

A number of different source gases may be used for the deposition of the undoped semiconductor material used for providing intrinsic base semiconductor material 18L of the first conductivity type and the intrinsic base semiconductor material 18R of the second conductivity type. In one embodiment, a combination of a silicon source gas and/or a germanium source gas can be used. Examples of silicon source gases that can be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that can be used include germane, digermane, halogermane, dichlorogermane, trichlorogermane, tetrachlorogermane and combinations thereof. In some embodiments, a single source gas that includes a silicon component and a germanium component may be used in forming an undoped SiGe material. Carrier gases like hydrogen, nitrogen, helium and argon can be used during the epitaxial growth process.

Following the epitaxial growth of the undoped semiconductor material, the intrinsic base semiconductor materials 18L, 18R can be formed in any order. In one example, the intrinsic base semiconductor material 18L of the first conductivity type can be formed first, followed by the formation of the intrinsic base semiconductor material 18R of the second conductivity type. In another example, the intrinsic base semiconductor material 18R of the second conductivity type can be formed first, followed by the formation of the intrinsic base semiconductor material 18L of the first conductivity type.

Notwithstanding the order of forming the intrinsic base semiconductor material 18L of the first conductivity type and the intrinsic base semiconductor material 18R of the second conductivity type, the introduction of dopants into the undoped semiconductor layer used in forming the intrinsic base semiconductor material 18L of the first conductivity type and the intrinsic base semiconductor material 18R of the second conductivity type can be performed utilizing one of the techniques mentioned above in forming the first horizontal semiconductor material region 16L of the first conductivity type and the first horizontal semiconductor material region 16R of the second conductivity type.

Figure 4:
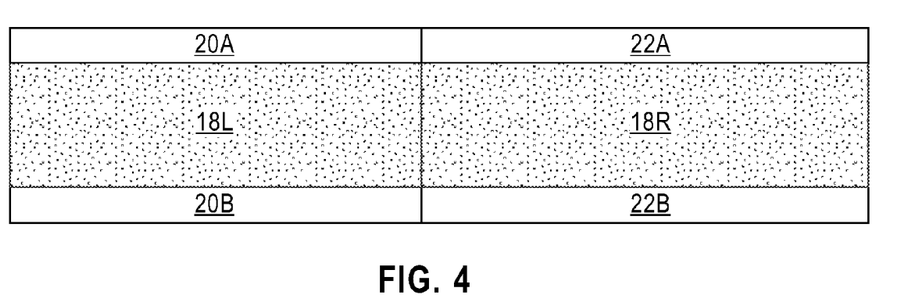
FIG. 4 is a top-down view of the exemplary semiconductor structure of FIG. 3 after forming first and second sidewall semiconductor material portions of the first conductivity type and the first dopant concentration within each vertical sidewall of the intrinsic base semiconductor material of the first conductivity type that is oriented in a width-wise direction, and forming first and second sidewall semiconductor material portions of the second conductivity type and the second dopant concentration within each vertical sidewall of the intrinsic base semiconductor material of the second conductivity type that is oriented in the width-wise direction.

Referring now to FIG. 4, there is illustrated the exemplary semiconductor structure of FIG. 3 after forming first and second sidewall semiconductor material portions 20A, 20B of the first conductivity type and the first dopant concentration within each vertical sidewall of the intrinsic base semiconductor material 18L of the first conductivity type that is oriented in a width-wise direction, and forming first and second sidewall semiconductor material portions 22A, 22B of the second conductivity type and the second dopant concentration within each vertical sidewall of the intrinsic base semiconductor material 18R of the second conductivity type that is oriented in the width-wise direction. Throughout the present application, the term "width-wise direction" denotes a direction that extends from 20A to 20B, or from 22A to 22B, in FIG. 4. The vertical sidewalls of the intrinsic base semiconductor material 18L, 18R that are in the width-wise direction are also oriented parallel to each other. Each intrinsic base semiconductor material 18L, 18R also includes two vertical sidewalls that are parallel to each other and are oriented in a non-width-wise direction.

The first and second sidewall semiconductor material portions 20A, 20B of the first conductivity type extend entirely through the intrinsic base semiconductor material 18L and contact an upper surface of the underlying first horizontal semiconductor material region 16L. Likewise, the first and second sidewall semiconductor material portions 22A, 22B of the second conductivity type extend entirely through the intrinsic base semiconductor material 18R and contact an upper surface of the underlying first horizontal semiconductor material region 16R.

The order of forming the first and second sidewall semiconductor material portions 20A, 20B and the first and second sidewall semiconductor material portions 22A, 22B can vary. Also, the first and second sidewall semiconductor material portions 20A, 20B and the first and second sidewall semiconductor material portions 22A, 22B can be formed by introducing an appropriate dopant type into each vertical sidewall of the intrinsic base semiconductor materials 18L, 18R that is oriented in the width-wise direction utilizing the techniques mentioned above for introducing dopants into the semiconductor material layer 14.

Figure 5:
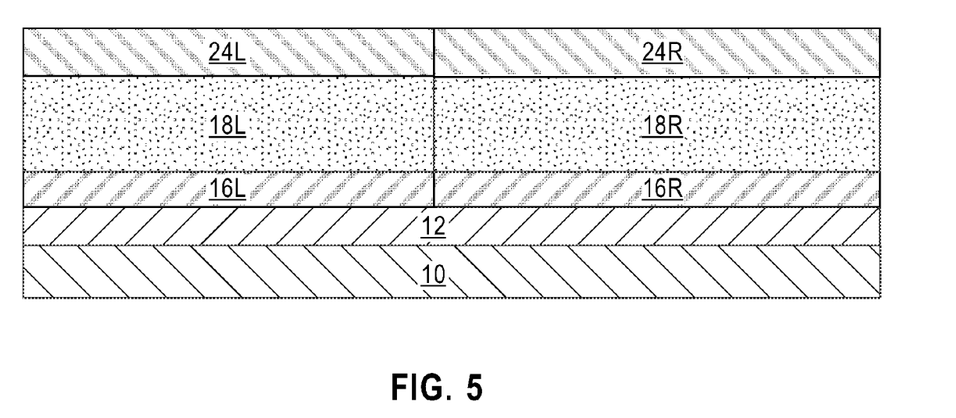
FIG. 5 is a cross sectional view of the exemplary semiconductor structure of FIG. 4 after forming a second horizontal semiconductor material region of the first conductivity type and the first dopant concentration on an exposed upper surface of the intrinsic base semiconductor material of the first conductivity type, and forming a second horizontal semiconductor material region of the second conductivity type and the second dopant concentration on an exposed upper surface of the intrinsic base semiconductor material of the second conductivity type.

Referring now to FIG. 5, there is illustrated the exemplary semiconductor structure of FIG. 4 after forming a second horizontal semiconductor material region 24L of the first conductivity type and the first dopant concentration on an exposed upper surface of the intrinsic base semiconductor material 18L of the first conductivity type, and forming a second horizontal semiconductor material region 24R of the second conductivity type and the second dopant concentration on an exposed upper surface of the intrinsic base semiconductor material 18R of the second conductivity type. A portion of the second horizontal semiconductor material region 24L of the first conductivity type also extends onto an upper surface of the first and second sidewall semiconductor material portions 20A, 20B. Likewise, a portion of the second horizontal semiconductor material region 24R of the second conductivity type also extends onto an upper surface of the first and second sidewall semiconductor material portions 22A, 22B.

The second horizontal semiconductor material region 24L of the first conductivity type and the second horizontal semiconductor material region 24R of the second conductivity type comprise a same semiconductor material including one of the semiconductor materials mentioned above for semiconductor material layer 14. In one embodiment of the present application, the second horizontal semiconductor material region 24L of the first conductivity type and the second horizontal semiconductor material region 24R of the second conductivity type comprise a same semiconductor material as the corresponding underlying intrinsic base semiconductor material 18L, 18R. For example, each of the second horizontal semiconductor material region 24L of the first conductivity type, the second horizontal semiconductor material region 24R of the second conductivity type, the intrinsic base semiconductor material 18L of the first conductivity type, and the intrinsic base semiconductor material 18R of the second conductivity type may comprise Si or SiGe. In another embodiment of the present application, the second horizontal semiconductor material region 24L of the first conductivity type and the second horizontal semiconductor material region 24R of the second conductivity type comprise a different semiconductor material as the corresponding underlying intrinsic base semiconductor material 18L, 18R. For example, each of the second horizontal semiconductor material region 24L of the first conductivity type and the second horizontal semiconductor material region 24R of the second conductivity type may comprise SiGe, while the corresponding underlying intrinsic base semiconductor material 18L, 18R may comprise Si.

The second horizontal semiconductor material region 24L of the first conductivity type may have an epitaxial relationship, i.e., identical crystal surface, as the upper surface of the intrinsic base semiconductor material 18L of the first conductivity type, and the second horizontal semiconductor material region 24R of the second conductivity type may have an epitaxial relationship, i.e., identical crystal surface, as that of the intrinsic base semiconductor material 18R of second first conductivity type. There can also exist an epitaxial relationship between the portion of the second horizontal semiconductor material region 24L of the first conductivity type that extends onto the upper surface of the first and second sidewall semiconductor material portions 20A, 20B. Likewise, there can also exist an epitaxial relationship between the portion of the second horizontal semiconductor material region 24R of the second conductivity type that extends onto the upper surface of the first and second sidewall semiconductor material portions 22A, 22B.

In one embodiment, the second horizontal semiconductor material region 24L of the first conductivity type is an n-type semiconductor material containing n-type dopants, and the second horizontal semiconductor material region 24R of the second conductivity type is a p-type semiconductor material containing p-type dopants. In one embodiment, the second horizontal semiconductor material region 24L of the first conductivity type is a p-type semiconductor material containing p-type dopants, and the second horizontal semiconductor material region 24R of the second conductivity type is an n-type semiconductor material containing n-type dopants. The term "p-type" and "n-type" used here for describing the intrinsic base semiconductor material 18L, 18R are the same as previously described above.

The first dopant concentration of the second horizontal semiconductor material region 24L of the first conductivity type is within the range mentioned above for the first horizontal semiconductor material region 16L of the first conductivity type, while the second dopant concentration of the second horizontal semiconductor material region 24R of the second conductivity type is within the range mentioned above for the first horizontal semiconductor material region 16R of the second conductivity type.

In some embodiments of the present application, the first dopant concentration of the second horizontal semiconductor material region 24L of the first conductivity type is the same as that of the second concentration of the second horizontal semiconductor material region 24R of the second conductivity type. In other embodiments of the present application, the second dopant concentration of the second horizontal semiconductor material region 24L of the first conductivity type is different, i.e., lesser than or greater than, the second dopant concentration of the second horizontal semiconductor material region 24R of the second conductivity type.

The second horizontal semiconductor material region 24L of the first conductivity type and the second horizontal semiconductor material region 24R of the second conductivity type can be formed by first epitaxial growing (i.e., epitaxial depositing) an undoped semiconductor layer on the exposed surfaces of the entire structure shown in FIG. 4. The epitaxial growth techniques and conditions mentioned above in forming the undoped semiconductor material used in providing the intrinsic base semiconductor materials 18L, 18R are applicable here for forming the undoped semiconductor material used in providing the second horizontal semiconductor material region 24L of the first conductivity type and the second horizontal semiconductor material region 24R of the second conductivity type. In one embodiment, the undoped semiconductor material that is formed has a thickness from 20 nm to 200 nm. Other thicknesses that are greater than or lesser than the aforementioned thickness range can also be used for the thickness of the undoped semiconductor material.

Following the epitaxial growth of the undoped semiconductor material, the second horizontal semiconductor material region 24L of the first conductivity type and the second horizontal semiconductor material region 24R of the second conductivity type can be formed into different regions of the undoped semiconductor material in any order. Notwithstanding the order of forming the second horizontal semiconductor material region 24L of the first conductivity type and the second horizontal semiconductor material region 24R of the second conductivity type, the dopant used in providing the second horizontal semiconductor material region 24L of the first conductivity type and the second horizontal semiconductor material region 24R of the second conductivity type can be introduced into the previously formed undoped semiconductor material layer utilizing one of the techniques mentioned above for introducing dopants within the semiconductor material layer 14.

In one embodiment, each second horizontal semiconductor material region 14L, 14R is a polycrystalline semiconductor material, having no epitaxial relationship to the upper surface of the corresponding underlying intrinsic base semiconductor material. A polycrystalline semiconductor material can be deposited by using commonly used deposition techniques such as chemical vapor deposition.

Figure 6:
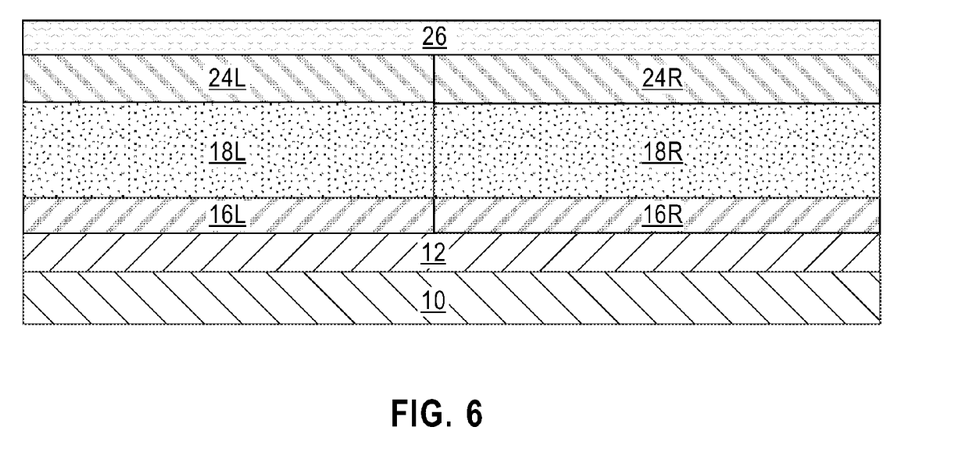
FIG. 6 is a cross sectional view of the exemplary semiconductor structure of FIG. 5 after forming a hard mask on a surface of the second horizontal semiconductor material regions of the first and second conductivity types.

Referring now to FIG. 6, there is illustrated the exemplary semiconductor structure of FIG. 5 after forming a hard mask 26 on a surface of the first and second horizontal semiconductor material regions 24L, 24R. The hard mask 26 can comprise any hard mask material including, for example, a dielectric oxide, a dielectric nitride and/or a dielectric oxynitride. In one example, the hard mask 26 may comprise a layer of silicon nitride and/or silicon oxynitride.

The hard mask 26 can be formed by applying a blanket layer of a hard mask material to the surface of the structure shown in FIG. 5. The hard mask 26 can be formed utilizing a deposition process including, for example, chemical vapor deposition (CVD), plasma enhanced chemical vapor deposition (PECVD), chemical solution deposition, evaporation, or physical vapor deposition (PVD). In one example, the hard mask 26 comprises silicon nitride formed by chemical vapor deposition at a deposition temperature of from 600° C. to 800° C.

In one embodiment, the hard mask 26 that is formed has a thickness from 20 nm to 200 nm. Other thicknesses that are greater than or lesser than the aforementioned thickness range can also be used for the thickness of the hard mask 26.

Figure 7A:
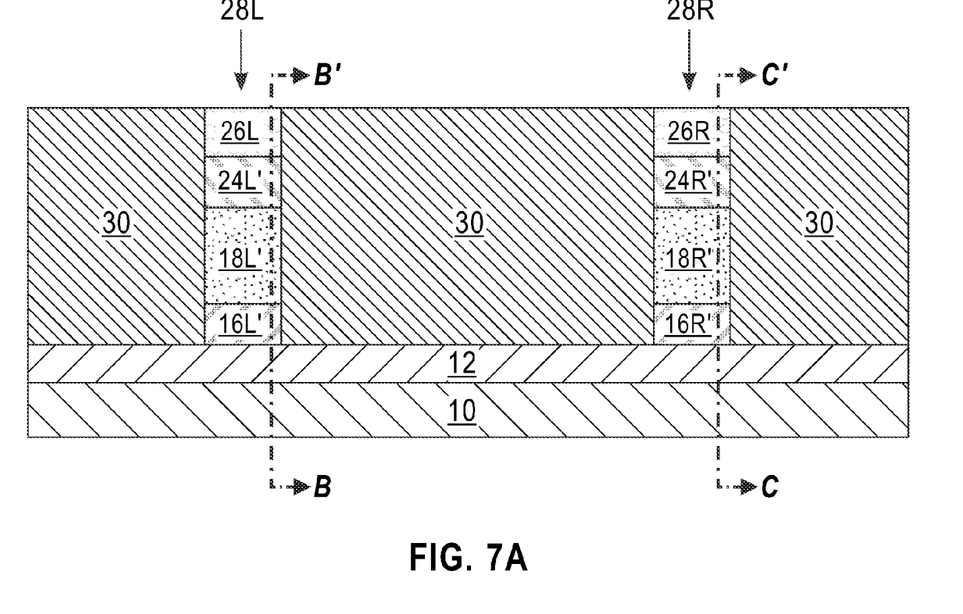
FIG. 7A is a cross sectional view of the exemplary semiconductor structure of FIG. 6 after forming a first conductivity type material stack, a second conductivity type material stack and trench isolation regions adjacent the first conductivity type material stack and the second conductivity type material stack.
Figure 7B:
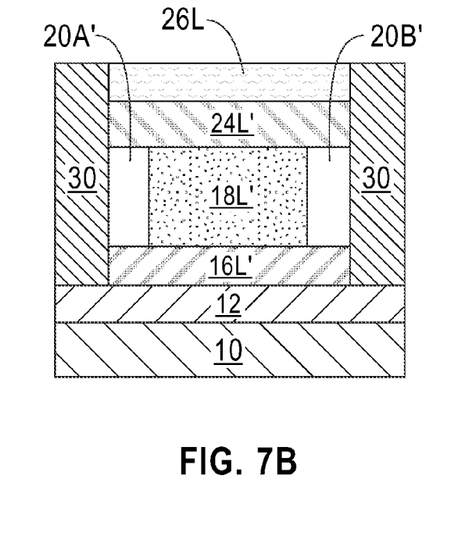
FIG. 7B is a cross sectional view of the exemplary semiconductor structure of FIG. 7A along vertical plane B-B'.
Figure 7C:
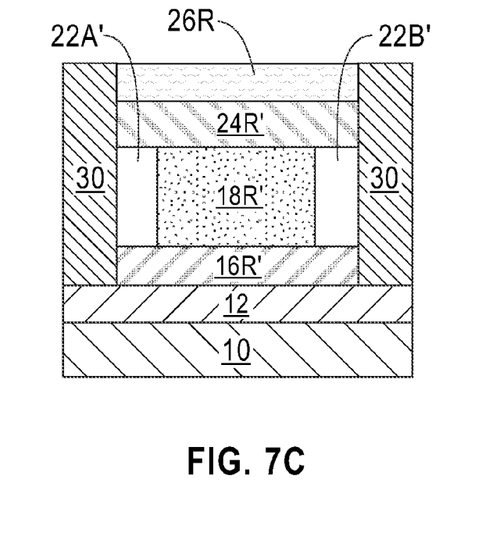
FIG. 7C is a cross sectional view of the exemplary semiconductor structure of FIG. 7A along vertical plane C-C'.

Referring now to FIGS. 7A-7C, there are shown the exemplary semiconductor structure of FIG. 6 after forming a first conductivity type material stack 28L, a second conductivity type material stack 28R and trench isolation regions 30. The trench isolation regions 30 are located adjacent the first conductivity type material stack 28L and the second conductivity type material stack 28R. Each trench isolation region 30 that is formed has a bottommost surface in direct contact with an uppermost surface of the insulator layer 12 of the SOI substrate. Sidewalls of the trench isolation regions contact vertical sidewalls of at least one of the first conductivity type material stack 28L and the second conductivity type material stack 28R that are oriented in a non-width-wise direction.

The first conductivity type material stack 28L comprises, from bottom to top, a first horizontal semiconductor material portion 16L' of the first conductivity type, an intrinsic base semiconductor material portion 18L' of the first conductivity type, a second horizontal semiconductor material portion 24L'of the first conductivity type, and a first hard mask portion 26L. The first conductivity type material stack 28L provides a base first conductivity type (i.e., n or p) region of one of the SOI bipolar transistors of the present application.

The second conductivity type material stack 28R comprises, from bottom to top, a first horizontal semiconductor material portion 16R' of the second conductivity type, an intrinsic base semiconductor material portion 18R' of the second conductivity type, a second horizontal semiconductor material portion 24R' of the second conductivity type, and a second hard mask material portion 26R. The second conductivity type material stack 28R provides a base second conductivity type (i.e., n or p) region of one of the SOI bipolar transistors of the present application.

The structure shown in FIGS. 7A-7C is formed by first providing trenches within the structure shown in FIG. 6 utilizing lithography and etching. The lithographic step can include forming a photoresist (not shown) atop the hard mask 26, exposing the photoresist to a desired pattern, i.e., trench pattern(s), of radiation and then developing the exposed photoresist utilizing a conventional resist developer. The pattern(s) within the photoresist is(are) then transferred through the hard mask 26 and into the underlying semiconductor material layers stopping on an upper surface of the insulator layer 12. A single etch or multiple etching can be used to provide the structure illustrated in FIG. 7A-7C. The etch or multiple etch can include a dry etch process, a chemical wet etch process, or any combination thereof. When a dry etch is used, the dry etch can be a reactive ion etch process, a plasma etch process, ion beam etching or laser ablation. The patterned photoresist material can be removed anytime after transferring the pattern into at least the hard mask 26 utilizing a conventional stripping process.

After etching and removing the photoresist, each trench can be filled with a trench dielectric material such as an oxide forming trench isolation region 30. Optionally, a densification step may be performed after the trench fill and a planarization process may follow the trench fill as well. As shown in the drawings, the uppermost surface of each trench dielectric material is coplanar with the uppermost surface of each hard mask portion 26L, 26R.

In the embodiment illustrated in the present application, first trenches are formed into portions of the second horizontal semiconductor material region 24L of the first conductivity type, portions of the intrinsic base semiconductor material 18L of the first conductivity type, and portions of the first horizontal semiconductor region 16L of the first conductivity type, and second trenches are also formed, simultaneously with the first trenches, into portions of the second horizontal semiconductor material region 24R of the second conductivity type, portions of the intrinsic base semiconductor material 18R of the second conductivity type, and portions of the first horizontal semiconductor region 16R of the second conductivity type. A remaining portion of the second horizontal semiconductor material region 24L of the first conductivity type, a remaining portion of the intrinsic base semiconductor material 18L of the first conductivity type, and a remaining portion of the first horizontal semiconductor region 16L of the first conductivity type form the first conductivity type material stack 28L, while a remaining portion of the second horizontal semiconductor material region 24R of the second conductivity type, a remaining portion of the intrinsic base semiconductor material 18R of the second conductivity type, and a remaining portion of the first horizontal semiconductor region 16R of the second conductivity type form the second conductivity type material stack 28R.

During the formation of the trenches, the first and second sidewall semiconductor material portions 20A, 20B, 22A and 22B may be trimmed to a width that is less than their initial thickness. The trimmed first and second sidewall semiconductor material portions 20A, 20B, 22A and 22B are labeled as 20A', 20B', 22A' and 22B' in the drawings of the present application.

As is shown in FIG. 7B, the intrinsic base semiconductor material portion 18L' of the first conductivity type contains a bottommost surface having an interface with an uppermost surface of the first horizontal semiconductor material portion 16L' of the first conductivity type, an uppermost surface having an interface with a bottommost surface of the second horizontal semiconductor material portion 24L' of the first conductivity type, and two vertical sidewalls that are each located in a width-wise direction that have interfaces with the trimmed first and second sidewall semiconductor material portions 20A', 20B'. Each of the first horizontal semiconductor material portion 16L' of the first conductivity type, second horizontal semiconductor material portion 24L' of the first conductivity type, and trimmed first and second sidewall semiconductor material portions 20A', 20B' acts as a shield layer which shields the intrinsic base semiconductor material portion 18L' from the effects of charge build-up in the surrounding insulator material layers, i.e., insulator layer 12 and trench isolation region 30.

Likewise, and as is shown in FIG. 7C, the intrinsic base semiconductor material portion 18R' of the second conductivity type contains a bottommost surface having an interface with an uppermost surface of the first horizontal semiconductor material portion 16R' of the second conductivity type, an uppermost surface having an interface with a bottommost surface of the second horizontal semiconductor material portion 24R' of the second conductivity type, and two vertical sidewalls that are each oriented in a width-wise direction that have interfaces with the trimmed first and second sidewall semiconductor material portions 22A', 22B'. Each of the first horizontal semiconductor material portion 16R' of the second conductivity type, the second horizontal semiconductor material portion 24R' of the second conductivity type, and the trimmed first and second sidewall semiconductor material portions 22A', 22B' acts as a shield layer which shields the intrinsic base semiconductor material portion 18R' from the effects of charge build-up in the surrounding insulator material layers, i.e., insulator layer 12 and trench isolation region 30.

Figure 8A:
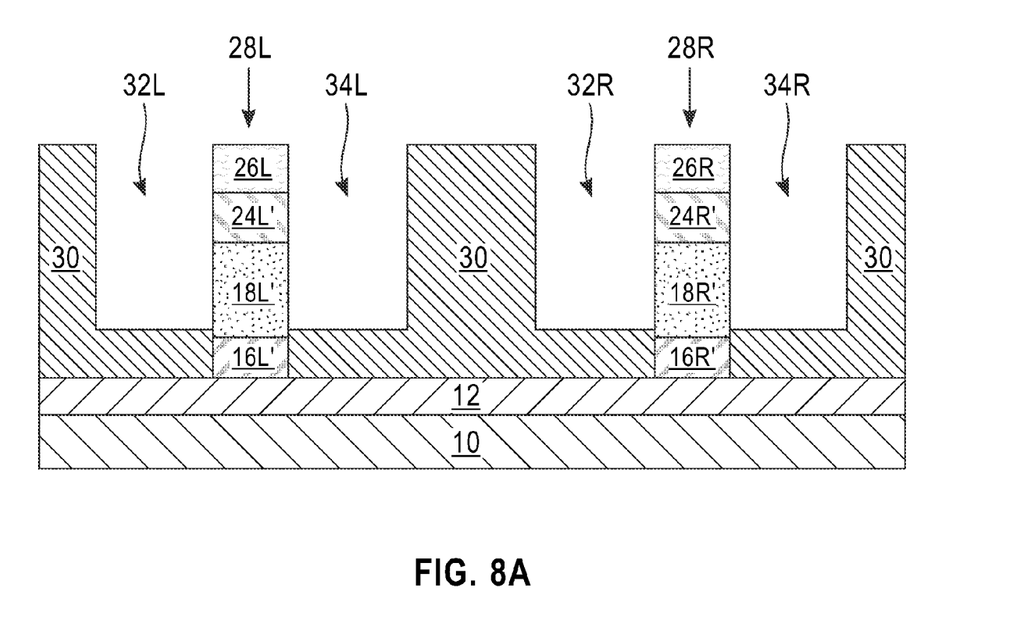
FIG. 8A is a cross sectional view of the exemplary semiconductor structure of FIG. 7A after formation of an emitter opening and a collector opening within the trench isolation regions located adjacent each of the first conductivity type material stack and the second conductivity type material stack.
Figure 8B:
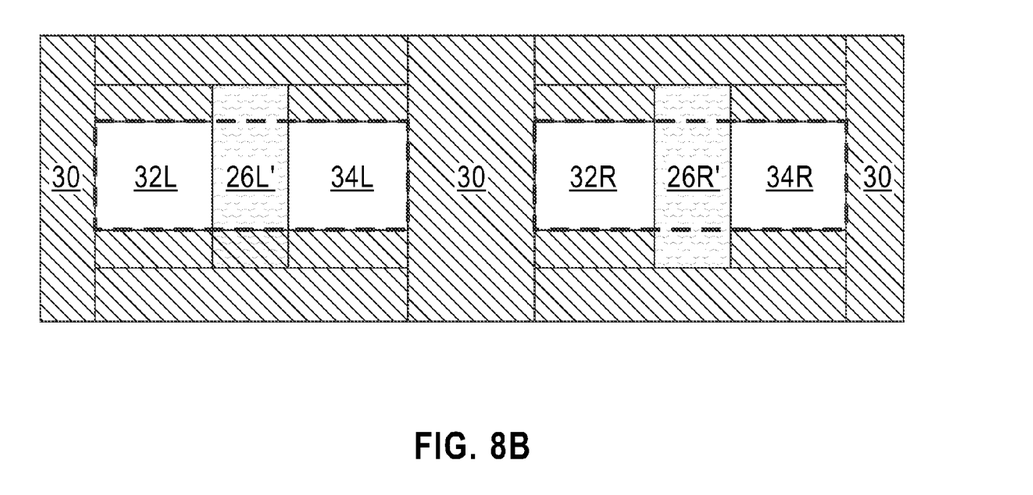
FIG. 8B is a top-down view of the exemplary semiconductor structure of FIG. 8A.

Referring now to FIGS. 8A-8B, there are shown the exemplary semiconductor structure of FIG. 7A after formation of an emitter opening 32L, 32R and a collector opening 34L, 34R within trench isolation regions 30 located adjacent each of the first conductivity type material stack 28L and the second conductivity type material stack 28R. The emitter contact opening 32L, 32R and the collector contact opening 34L, 34R can be formed by patterning the trench isolation regions 30 by lithography and etching.

As is shown, emitter opening 32L, 32R and the collector opening 34L, 34R expose portions of vertical sidewalls along the non-width-wise direction of each of the first conductivity type material stack 28L and the second conductivity type material stack 28R which is located above the first horizontal semiconductor material portions 16L' 16R'. The trimmed first and second sidewall semiconductor material portions 20A', 20B' 22A', 22B' remain in the structure.

Figure 9:
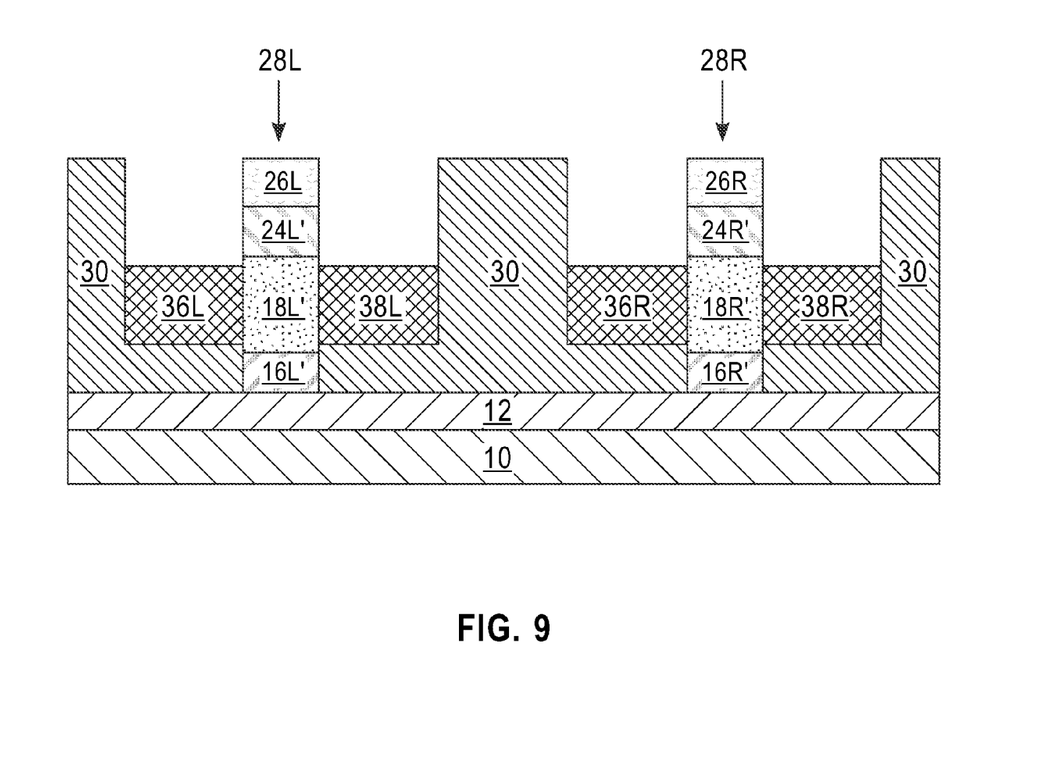

Referring now to FIG. 9, there is illustrated the exemplary semiconductor structure of FIG. 8A after formation of an emitter semiconductor material portion 36L of the second conductivity type in a lower portion of the emitter opening 32L located adjacent the first conductivity type material stack 28L, a collector semiconductor material portion 38L of the second conductivity type in a lower portion of the collector opening 34L located adjacent the first conductivity type material stack 28L, an emitter semiconductor material portion 36R of the first conductivity type in a lower portion of the emitter opening 32R located adjacent the second conductivity type material stack 28R, a collector semiconductor material portion 38R of the first conductivity type in a lower portion of the collector opening 34R located adjacent the second conductivity type material stack 28R.

As is shown in FIG. 9, each emitter semiconductor material portion 36L, 36R has a sidewall surface that is in direct physical contact, and thus forms and an interface, with one of the vertical sidewalls of the intrinsic base semiconductor material portions 18L', 18R' that is oriented in the non-width-wise direction, while each collector semiconductor material portion 38L, 38R has a sidewall surface that is in direct physical contact, and thus forms and an interface, with another of the vertical sidewalls of the intrinsic base semiconductor material portions 18L', 18R' that is oriented in the non-width-wise direction.

The emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type comprise a same semiconductor material selected from one of the semiconductor materials mentioned above for semiconductor material layer 14. In one embodiment of the present application, the emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type comprise a same semiconductor material as the corresponding adjoining intrinsic base semiconductor material portions 18L', 18R'. In another embodiment of the present application, the emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type comprise a different semiconductor material as the corresponding adjoining intrinsic base semiconductor material portions 18L', 18R'.

The emitter semiconductor material portion 36L of the second conductivity type and the collector semiconductor material portion 38L of the second conductivity type may have an epitaxial relationship, i.e., identical crystal surface, as exposed sidewall upper surface of the intrinsic base semiconductor material 18L of the first conductivity type. The emitter semiconductor material portion 36R of the first conductivity type and the collector semiconductor material portion 38R of the first conductivity type may have an epitaxial relationship, i.e., identical crystal surface, as exposed sidewall upper surface of the intrinsic base semiconductor material 18R of the second conductivity type.

In one embodiment, the emitter semiconductor material portion 36L of the second conductivity type and the collector semiconductor material portion 38L of the second conductivity type are semiconductor materials containing n-type dopants, while the intrinsic base semiconductor material portion 18L' of the first conductivity type is a semiconductor material containing p-type dopants. In another embodiment, the emitter semiconductor material portion 36L of the second conductivity type and the collector semiconductor material portion 38L of the second conductivity type are semiconductor materials containing p-type dopants, while the intrinsic base semiconductor material portion 18L' of the first conductivity type is a semiconductor material containing n-type dopants.

In one embodiment, the emitter semiconductor material portion 36R of the first conductivity type and the collector semiconductor material portion 38R of the first conductivity type are semiconductor materials containing n-type dopants, while the intrinsic base semiconductor material portion 18R' of the second conductivity type is a semiconductor containing p-type dopants. In another embodiment, the emitter semiconductor material portion 36R of the first conductivity type and the collector semiconductor material portion 38R of the first conductivity type are semiconductor materials containing n-type dopants, while the intrinsic base semiconductor material portion 18R' of the second conductivity type is a semiconductor containing p-type dopants.

In one embodiment, the emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type may each have a same dopant concentration that is within the range mentioned above for the first and second horizontal semiconductor material portions. In another embodiment, the emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type may each have a different dopant concentration, yet each dopant concentration is within the range mentioned above for the first and second horizontal semiconductor material portions.

The emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type may be formed by first epitaxial growing (i.e., epitaxial depositing) an undoped semiconductor layer on the exposed surfaces of the entire structure shown in FIG. 8A-8B The epitaxial growth techniques and conditions mentioned above in forming the undoped semiconductor material used in providing the intrinsic base semiconductor materials 18L, 18R are applicable here for forming the undoped semiconductor material used in providing the emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type. The undoped semiconductor material may grow from the exposed sidewalls of the intrinsic semiconductor base portions 18L, 18R. As shown, a bottommost surface of the undoped semiconductor material forms on the exposed recessed trench dielectric material surface. In one embodiment, undoped semiconductor material that is formed has a thickness from 20 nm to 200 nm. Other thicknesses that are greater than or lesser than the aforementioned thickness range can also be used for the thickness of the undoped semiconductor material.

Following the epitaxial growth of the undoped semiconductor material, an appropriate dopant type can be introduced into the undoped semiconductor material utilizing one of the techniques mentioned above in forming the first horizontal semiconductor material region 16L of the first conductivity type and the first horizontal semiconductor material region 16R of the second conductivity type.

In one embodiment, the emitter semiconductor material portion 36L of the second conductivity type, the emitter semiconductor material portion 36R of the first conductivity type, the collector semiconductor material portion 38L of the second conductivity type, and the collector semiconductor material portion 38R of the first conductivity type may be a polycrystalline semiconductor material formed by first depositing a polycrystalline semiconductor material to completely fill the emitter opening regions 32L, 32R and the collector opening regions 34L, 34R. Any excessive polycrystalline material can then be removed by a planarization process such as chemical mechanical polishing. This is followed by recessing the polycrystalline semiconductor material in the emitter opening regions 32L, 32R and in the collector opening regions 34L, 34R by reactive ion etching to form emitter semiconductor material portions 36L, 36R and collector semiconductor material portions 38L, 38R.

Figure 10A:
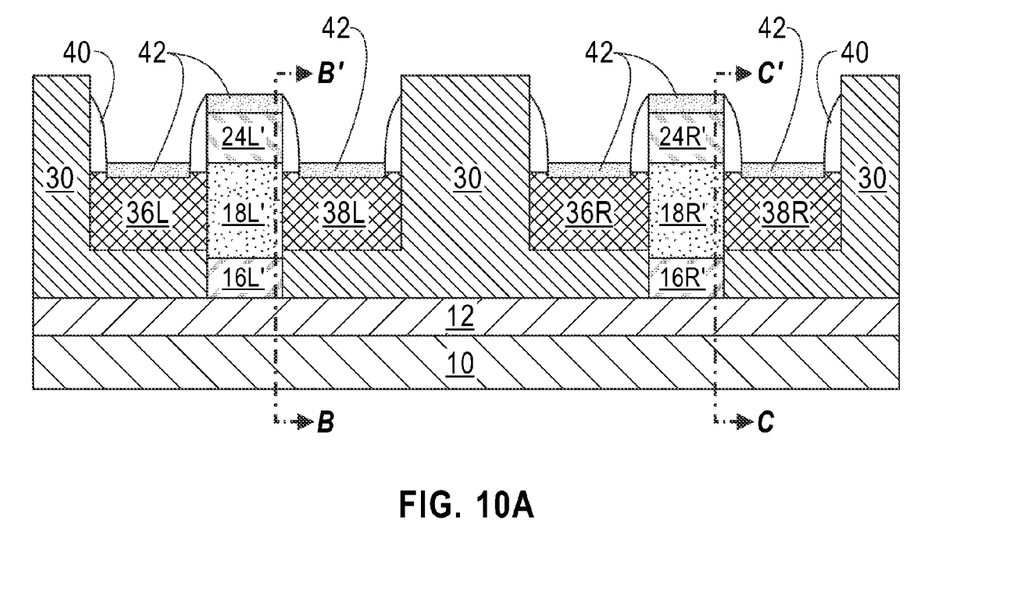
FIG. 10A is a cross sectional view of the exemplary semiconductor structure of FIG. 9 after formation of dielectric spacers within remaining upper portions of each of the emitter and collector openings, removing the first and second remaining hard mask portions, and forming a metal semiconductor alloy layer on exposed portions of each emitter semiconductor material portion, each collector semiconductor material portion and each remaining second horizontal semiconductor material portion.
Figure 10B:
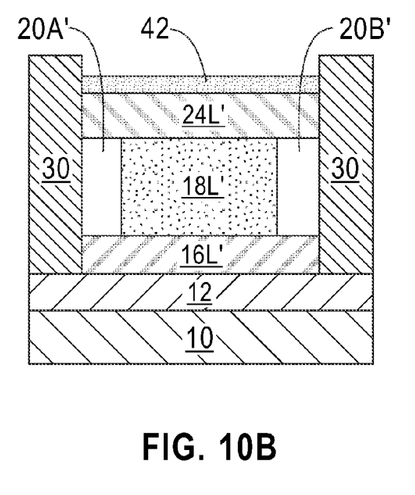
FIG. 10B is a cross sectional view of the exemplary semiconductor structure of FIG. 10A along vertical plane B-B'.
Figure 10C:
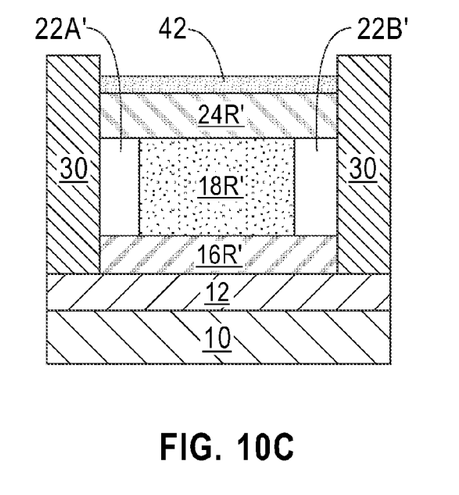
FIG. 10C is a cross sectional view of the exemplary semiconductor structure of FIG. 10A along vertical plane C-C'.

Referring now to FIGS. 10A-10C there is illustrated the exemplary semiconductor structure of FIG. 9 after formation of dielectric spacers 40 within remaining upper portions of each of the emitter and collector openings 32L, 32R, 34L, 34R, removing the first and second remaining hard mask portions 26L, 26R and forming a metal semiconductor alloy layer 42 on exposed portions of each emitter semiconductor material portion 36L, 36R, each collector semiconductor material portion 38R, 38R and each remaining second horizontal semiconductor material portion 24L', 24R'.

Each dielectric spacer 40 that is formed can be comprised of a dielectric material including, for example, an oxide, a nitride, and/or an oxynitride. In one embodiment, each dielectric spacer 40 is comprised of silicon oxide. In another embodiment, each dielectric spacer 40 is comprised of silicon nitride. The dielectric spacers 40 can be formed by depositing a blanket dielectric film and then etching the dielectric film from all horizontal surfaces. In one embodiment, a reactive ion etch can be used in forming the dielectric spacers 40. The width of each dielectric spacer 40, as measured at its base, is from 2 nm to 50 nm. Other widths that are greater than or lesser than the aforementioned width range can also be used for the width of the dielectric spacer 40. As is shown, a sidewall of one of the dielectric spacers formed in remaining upper portions of each of the emitter and collector openings 32L, 32R, 34L, 34R may be in direct physical contact with an exposed sidewall of the trench isolation region 30, while sidewalls of another of the dielectric spacers 40 formed in remaining upper portions of each of the emitter and collector openings 32L, 32R, 34L, 34R is in direct physical contact with a non-width-wise vertical sidewall of the second horizontal semiconductor material portion 24L', 24R'. As is also shown in the drawings, each dielectric spacer 40 formed in remaining upper portions of each of the emitter opening 32L, 32R has a bottommost surface that is in direct physical contact with an uppermost surface of the emitter semiconductor material portion 36L, 36R, while each dielectric spacer 40 formed in remaining upper portions of each of the collector opening 34L, 34R has a bottommost surface that is in direct physical contact with an uppermost surface of the collector semiconductor material portion 38L, 38R.

The removal of the first and second remaining hard mask portions 26L, 26R may occur during the formation of dielectric spacers 40, or after dielectric spacer 40 formation utilizing an etch that is separate from the etch used to provide the dielectric spacers 40.

The metal semiconductor alloy layers 42 can be formed by first depositing a metal semiconductor alloy forming metal such as for example, Ni, Pt, Co, and alloys such as NiPt, on the surface of each emitter semiconductor material portion 36L, 36R, each collector semiconductor material portion 38R, 38R and each remaining second horizontal semiconductor material portion 24L', 24R'. An anneal may be then performed that causes reaction between the metal semiconductor alloy forming metal and the semiconductor layer. After annealing, any unreactive metal can be removed. When Ni is used the NiSi phase is formed due to its low resistivity. For example, formation temperatures include 400° C.-600° C. Each metal semiconductor alloy layer 42 forms a low resistance contact to the underlying semiconductor material portions, i.e., each emitter semiconductor material portion 36L, 36R, each collector semiconductor material portion 38L, 38R and each remaining second horizontal semiconductor material portion 24L', 24R'.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
at least one first lateral bipolar transistor located atop a first portion of an insulator layer and comprising:
an intrinsic base semiconductor material portion of a first conductivity type and having a bottommost surface, an uppermost surface, and two vertical sidewalls oriented in a width-wise direction;
a first horizontal semiconductor material portion of said first conductivity type positioned between said bottommost surface of said intrinsic base semiconductor material portion of said first conductivity type and an uppermost surface of said insulator layer;
a second horizontal semiconductor material portion of said first conductivity type located directly on said uppermost surface of said intrinsic base semiconductor material portion of said first conductivity type;
a first sidewall semiconductor material portion of said first conductivity type located at one of said vertical sidewalls of said intrinsic base semiconductor material portion of said first conductivity type that is oriented in said width-wise direction; and a second sidewall semiconductor material portion of said first conductivity type located at another of said vertical sidewalls of said intrinsic base semiconductor material portion of said first conductivity type that is oriented in said width-wise direction, wherein said first horizontal semiconductor material portion of said first conductivity type, said second horizontal semiconductor material portion of said first conductivity type, and said first and second sidewall semiconductor material portions of said first conductivity type each have a higher dopant concentration than said intrinsic base semiconductor material portion of said first conductivity type and shield any surface of said intrinsic base semiconductor material portion from direct contact with an insulator material, wherein said first conductivity type consisting entirely of an n-type dopant or entirely of a p-type dopant.

2. The semiconductor structure of claim 1, wherein said at least one first lateral bipolar transistor further comprises:

an emitter semiconductor material portion of a second conductivity type opposite from said first conductivity type in direct physical contact with one vertical sidewall of said intrinsic base semiconductor material portion of said first conductivity type that is oriented in a non-width wise direction; and a collector semiconductor material portion of said second conductivity type in direct physical contact with another vertical sidewall of said intrinsic base semiconductor material portion of said first conductivity type that is oriented in said non-width wise direction.

3. The semiconductor structure of claim 2, further comprising a dielectric spacer located on an uppermost surface of each of said emitter semiconductor material portion of said second conductivity type and said collector semiconductor material portion of said second conductivity type and having a sidewall in direct physical contact with a vertical sidewall of said second horizontal semiconductor material portion of said first conductivity type.

4. The semiconductor structure of claim 2, wherein a metal semiconductor alloy layer is present on an upper surface portion of each of said emitter semiconductor material portion of said second conductivity type, said collector semiconductor material portion of said second conductivity type and said second horizontal semiconductor material portion of said first conductivity type.

5. The semiconductor structure of claim 2, wherein said first conductivity type is n-type and said second conductivity is p-type.

6. The semiconductor structure of claim 2, wherein said first conductivity type is p-type and said second conductivity is n-type.

7. The semiconductor structure of claim 1, wherein said intrinsic base semiconductor material portion of a first conductivity type has an epitaxial relationship with said first horizontal semiconductor material portion of said first conductivity type, and said second horizontal semiconductor material portion of said first conductivity type has an epitaxial relationship with said intrinsic base semiconductor material portion of said first conductivity type.

8. The semiconductor structure of claim 1, further comprising
at least one second lateral bipolar transistor located atop another portion of said insulator layer and adjacent to, but isolated from, said at least one first lateral bipolar transistor, said at least one second lateral bipolar transistor comprising:

an intrinsic base semiconductor material portion of said second conductivity type located above, but not in direct physical contact with said uppermost surface of said insulator layer, wherein said intrinsic base semiconductor material portion of said second conductivity type has a bottommost surface, an uppermost surface, and two vertical sidewalls oriented in a width-wise direction;

a first horizontal semiconductor material portion of said second conductivity type positioned between said bottommost surface of said intrinsic base semiconductor material portion of said second conductivity type and said uppermost surface of said insulator layer;

a second horizontal semiconductor material portion of said second conductivity type located directly on said uppermost surface of said intrinsic base semiconductor material portion of said second conductivity type;

a first sidewall semiconductor material portion of said second conductivity type located at one of said vertical sidewalls of said intrinsic base semiconductor material portion of said second conductivity type that is oriented in said width-wise direction; and a second sidewall semiconductor material portion of said second conductivity type located at another of said vertical sidewalls of said intrinsic base semiconductor material portion of said second conductivity type that is oriented in said width-wise direction, wherein said first horizontal semiconductor material portion of said second conductivity type, said second horizontal semiconductor material portion of said second conductivity type, and said first and second sidewall semiconductor material portions of said second conductivity type each have a higher dopant concentration than said intrinsic base semiconductor material portion of said second conductivity type.

9. The semiconductor structure of claim 8, wherein said at least one second lateral bipolar transistor further comprising:

an emitter semiconductor material portion of said first conductivity type opposite from said second conductivity type in direct physical contact with one vertical sidewall of said intrinsic base semiconductor material portion of said second conductivity type that is oriented in a non- width wise direction; and a collector semiconductor material portion of said first conductivity type in direct physical contact with another vertical sidewall of said intrinsic base semiconductor material portion of said second conductivity type that is oriented in said non-width wise direction.

10. The semiconductor structure of claim 9, further comprising a dielectric spacer located on an uppermost surface of each of said emitter semiconductor material portion of said first conductivity type and said collector semiconductor material portion of said first conductivity type and having a sidewall in direct physical contact with a vertical sidewall of said second horizontal semiconductor material portion of said second conductivity type.

11. The semiconductor structure of claim 9, wherein a metal semiconductor alloy layer is present on an upper surface portion of each of said emitter semiconductor material portion of said first conductivity type, said collector semiconductor material portion of said first conductivity type and said second horizontal semiconductor material portion of said second conductivity type.

12. The semiconductor structure of claim 9, wherein said first conductivity type is n-type and said second conductivity is p-type.

13. The semiconductor structure of claim 9, wherein said first conductivity type is p-type and said second conductivity is n-type.

14. The semiconductor structure of claim 8, wherein said intrinsic base semiconductor material portion of a second conductivity type has an epitaxial relationship with said first horizontal semiconductor material portion of said second conductivity type, and said second horizontal semiconductor material portion of said second conductivity type has an epitaxial relationship with said intrinsic base semiconductor material portion of a second conductivity type.

15. A method of forming a semiconductor structure comprising:
providing a semiconductor stack comprising, from bottom to top, a first horizontal semiconductor material region of a first conductivity type and a first dopant concentration and an intrinsic base semiconductor material of said first conductivity type and a second dopant concentration, on a surface on an insulator layer, wherein said first dopant concentration is greater than said second dopant concentration;
forming sidewall semiconductor material portions of said first conductivity type and said first dopant concentration within each vertical sidewall of said intrinsic base semiconductor material of said first conductivity type that is oriented in a width-wise direction;
forming a second horizontal semiconductor material region of said first conductivity type and said first dopant concentration, atop said intrinsic base semiconductor material of said first conductivity type;
removing portions of said second horizontal semiconductor material region of said first conductivity type, portions of sidewall semiconductor material portions of said first conductivity type, portions of said intrinsic base semiconductor material of said first conductivity type, and portions of said first horizontal semiconductor material region of said first conductivity type to provide a first conductivity type material stack comprising, from bottom to top, a remaining portion of said first horizontal semiconductor material region of said first conductivity type, a remaining portion of said intrinsic base semiconductor material of said first conductivity type, and a remaining portion of said second horizontal semiconductor material region of said first conductivity type, wherein a remaining portion of said sidewall semiconductor material portions of said first conductivity type is present on each vertical sidewall of said remaining portion of said intrinsic base semiconductor material of said first conductivity type that is oriented in said width-wise direction.

16. The method of claim 15, further comprising:
forming an emitter semiconductor material portion of a second conductivity type opposite from said first conductivity type in direct physical contact with one vertical sidewall of said remaining portion of said intrinsic base semiconductor material of said first conductivity type that is oriented in a non-width wise direction; and
forming a collector semiconductor material portion of said second conductivity type in direct physical contact with another vertical sidewall of said remaining portion of said intrinsic base semiconductor material of said first conductivity type that is oriented in said non-width wise direction.

17. The method of claim 16, further comprising forming a dielectric spacer on an uppermost surface of each of said emitter semiconductor material portion of said second conductivity type and said collector semiconductor material portion of said second conductivity type and having a sidewall in direct physical contact with a vertical sidewall of said second horizontal semiconductor material portion of said first conductivity type.

18. The semiconductor structure of claim 17, wherein further comprising:
forming a metal semiconductor alloy layer on an upper surface portion of each of said emitter semiconductor material portion of said second conductivity type, said collector semiconductor material portion of said second conductivity type and said remaining portion of said second horizontal semiconductor material portion of said first conductivity type.

19. The method of claim 15, wherein said first conductivity type is p-type and said second conductivity type of n-type.

20. The method of claim 15, wherein said first conductivity type is n-type and said second conductivity type of p-type.

* * * * *